(12) United States Patent
Kozawa et al.

(10) Patent No.: US 12,119,184 B2
(45) Date of Patent: Oct. 15, 2024

(54) POWER GENERATOR

(71) Applicants: DENSO CORPORATION, Kariya (JP); TOKYO UNIVERSITY OF SCIENCE FOUNDATION, Tokyo (JP)

(72) Inventors: Yoshihiro Kozawa, Kariya (JP); Noriyuki Matsushita, Kariya (JP); Kazuhiko Kano, Kariya (JP); Yumi Tanaka, Shinjuku-ku (JP); Hiroki Otsuka, Shinjuku-ku (JP); Yusuke Edano, Shinjuku-ku (JP)

(73) Assignees: DENSO CORPORATION, Kariya (JP); TOKYO UNIVERSITY OF SCIENCE FOUNDATION, Tokyo (JP)

( * ) Notice: Subject to any disclaimer, the term of this patent is extended or adjusted under 35 U.S.C. 154(b) by 260 days.

(21) Appl. No.: 17/886,538

(22) Filed: Aug. 12, 2022

(65) Prior Publication Data

US 2022/0392711 A1    Dec. 8, 2022

Related U.S. Application Data

(63) Continuation of application No. PCT/JP2021/006746, filed on Feb. 24, 2021.

(30) Foreign Application Priority Data

Feb. 28, 2020   (JP) ................. 2020-032539

(51) Int. Cl.
*H02N 1/08* (2006.01)
*H01G 7/02* (2006.01)
(Continued)

(52) U.S. Cl.
CPC .............. *H01G 7/025* (2013.01); *H02N 1/08* (2013.01)

(58) Field of Classification Search
CPC .......... H02K 35/02; H02K 36/02; H02N 1/00; H02N 1/06; H02N 1/08
(Continued)

(56) References Cited

U.S. PATENT DOCUMENTS 8,212,450 B2 * 7/2012 Mabuchi ................ H02N 1/004
310/309
2010/0052469 A1    3/2010 Naruse et al.
(Continued)

FOREIGN PATENT DOCUMENTS

JP        4871642 B2       2/2012
JP     2017028868 A  *    2/2017
JP        6465377 B2       2/2019

OTHER PUBLICATIONS

U.S. Appl. No. 17/886,548, filed Aug. 12, 2022, Kozawa et al.

*Primary Examiner* — Jose A Gonzalez Quinones
(74) *Attorney, Agent, or Firm* — Posz Law Group, PLC

(57) ABSTRACT

A power generator includes an electret including a first charged surface and a second charged surface having opposite polarities, a first electrode partially formed on the first charged surface, a second electrode formed on the second charged surface, a third electrode disposed to face the first charged surface with a space, and at least one of a power storage unit or an output unit. The first charged surface has a current collecting surface that is exposed outward. The first electrode and the second electrode form a first power generating unit and the third electrode and the second electrode form a second power generating unit. The electret is formed by polarizing an electret material that includes an inorganic dielectric having a bandgap energy of 4 eV or more.

7 Claims, 9 Drawing Sheets

(51) Int. Cl.
*H02K 35/02* (2006.01)
*H02N 1/00* (2006.01)

(58) Field of Classification Search
USPC .................. 310/300, 309, 323.06, 313 B
See application file for complete search history.

(56) References Cited

U.S. PATENT DOCUMENTS

| 2010/0072855 A1* | 3/2010 | Matsubara ............... H02N 1/08 |
| | | 310/300 |
| 2010/0109472 A1 | 5/2010 | Naruse et al. |
| 2011/0263785 A1* | 10/2011 | Kashiwagi ............. H01G 7/023 |
| | | 427/457 |
| 2012/0273904 A1 | 11/2012 | Defay et al. |

* cited by examiner

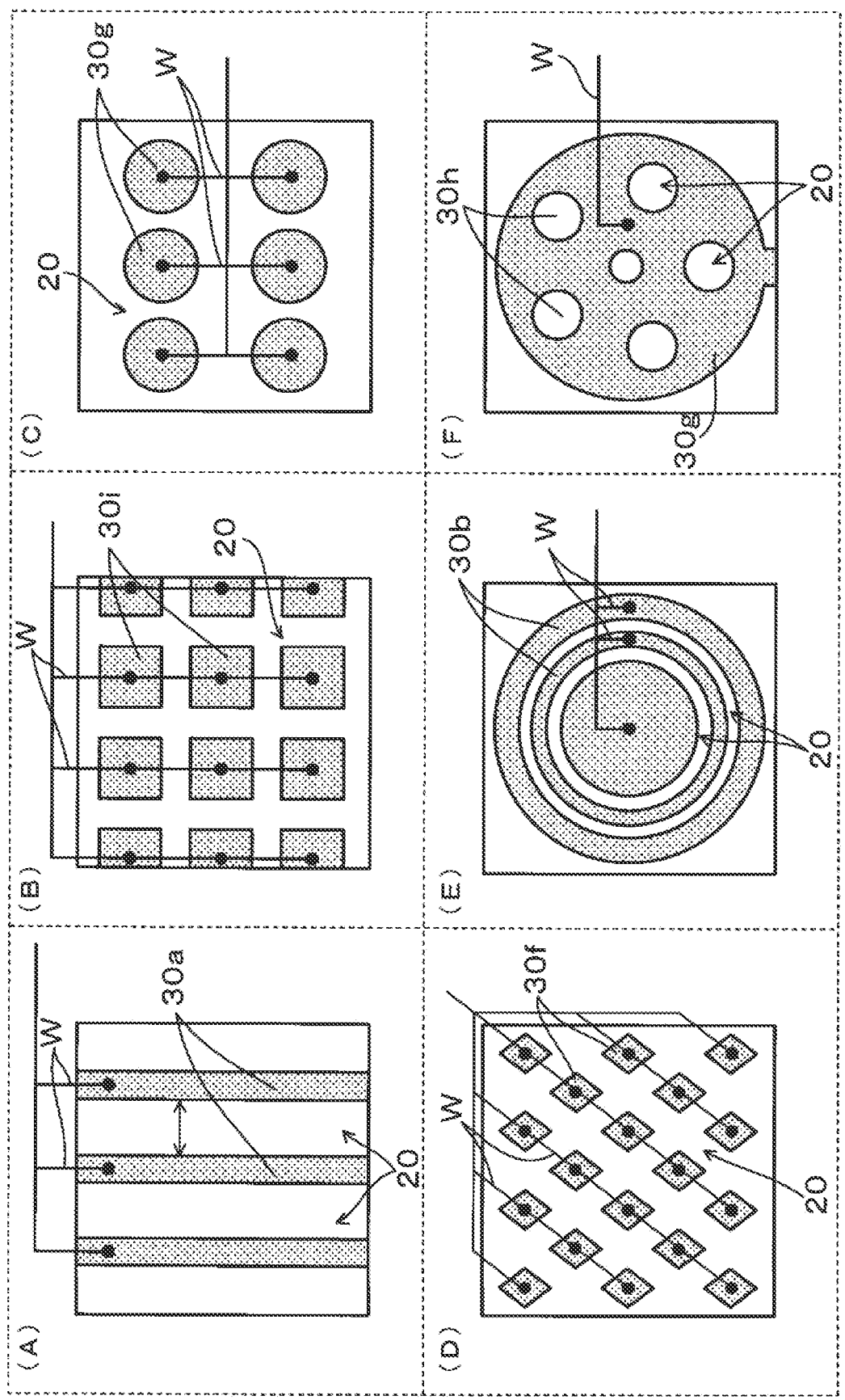

FIG. 14A
FIG. 14B
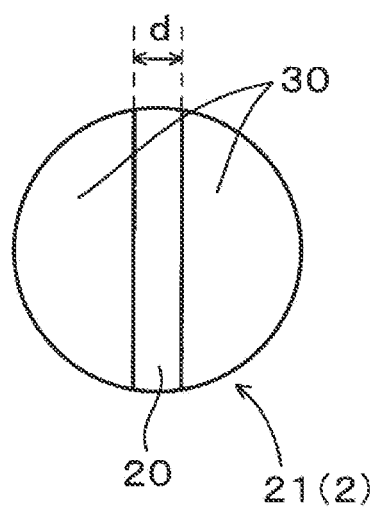
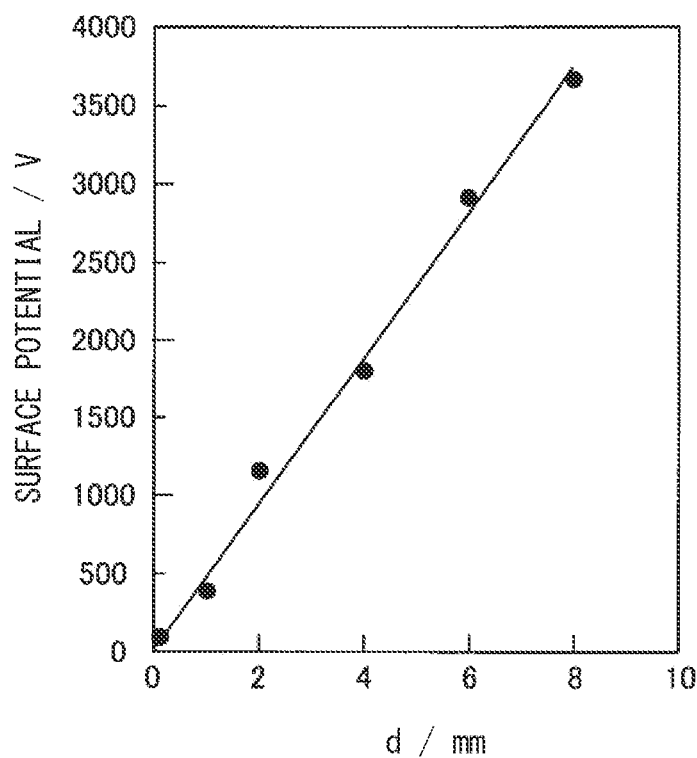

POWER GENERATOR

CROSS REFERENCE TO RELATED APPLICATIONS

The present application is a continuation application of International Patent Application No. PCT/JP2021/006746 filed on Feb. 24, 2021, which designated the U.S. and claims the benefit of priority from Japanese Patent Application No. 2020-032539 filed on Feb. 28, 2020. The entire disclosures of all of the above applications are incorporated herein by reference.

TECHNICAL FIELD

The present disclosure relates to a power generator using an electret.

BACKGROUND

As an energy harvesting technology for converting energy existing in the environment into electric power, practical application of an energy harvesting element using electrostatic induction of an electret has been studied. As an energy harvesting element using an electret, a vibration powered generator has been proposed.

SUMMARY

A power generator includes an electret, a first electrode, a second electrode, a third electrode, and at least one of a power storage unit or an output unit. The electret includes a first charged surface and a second charged surface. The first charged surface and the second charged surface have opposite polarities. The first electrode is partially formed on the first charged surface such that the first charged surface has a portion as a current collecting surface that is exposed outward. The second electrode is formed on the second charged surface. The third electrode is disposed to face the first charged surface with a space. The third electrode is configured to move relative to, and in parallel to, the first charged surface. The first electrode and the second electrode form a first power generating unit and the third electrode and the second electrode form a second power generating unit. At least one of the power storage unit or the output unit is electrically connected to both the first power generating unit and the second power generating unit. The electret is formed by polarizing an electret material that includes an inorganic dielectric having a bandgap energy of 4 eV or more.

BRIEF DESCRIPTION OF DRAWINGS

The above and other objectives, features and advantages of the present disclosure will become more apparent from the following detailed description with reference to the accompanying drawings. In the drawings:

FIG. 13 is a schematic view illustrating configuration examples of collective portions of electrode portions to be the first electrode formed on the electret in the second embodiment;

FIG. 14A is a schematic diagram of a measurement sample in a test example 3; and FIG. 14B is a graph illustrating a relationship between the surface potential and electrode distance of the electrode portions formed on the electret in the test example 3.

DESCRIPTION OF EMBODIMENTS

Figure 1:
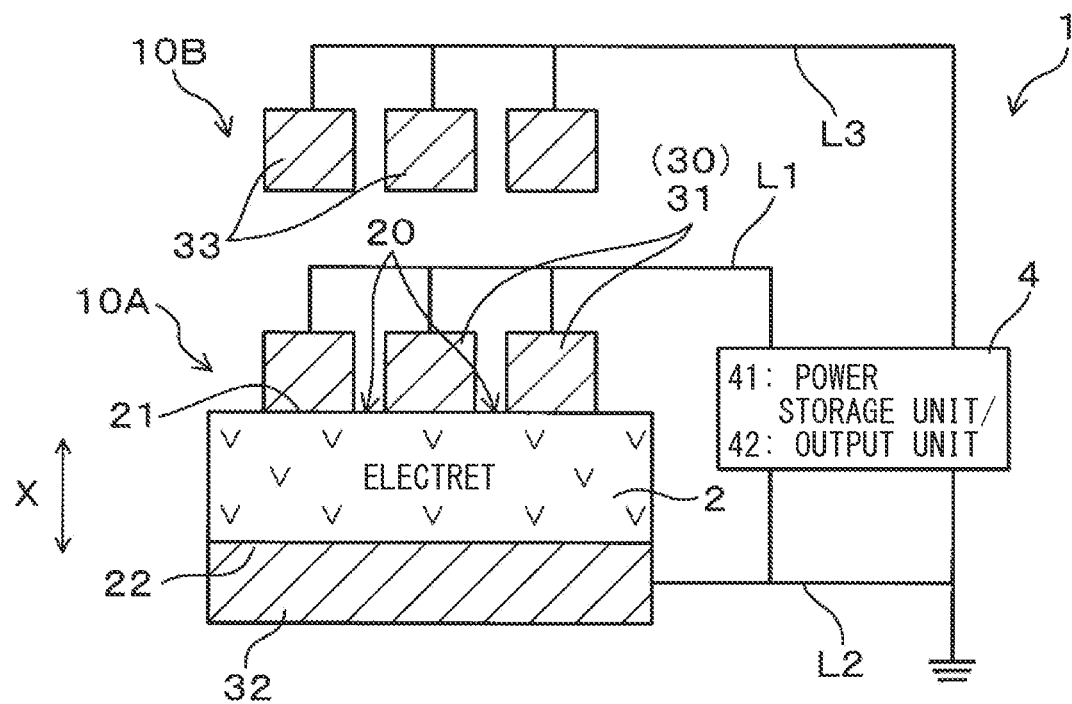
FIG. 1 is a schematic diagram illustrating an overall schematic configuration of a power generator according to the first embodiment.

To begin with, examples of relevant techniques will be described.

As an energy harvesting technology for converting energy existing in the environment into electric power, practical application of an energy harvesting element using electrostatic induction of an electret has been studied. An organic polymer material such as a fluororesin is generally used as a constituent material of the electret. For example, a chain-like fluororesin or a polymer having a fluoroaliphatic ring structure in a main chain is used.

As an energy harvesting element using an electret, a vibration powered generator has been proposed. In the vibration powered generator, when a movable electrode that faces an electret on a fixed electrode vibrates, the amount of electric charge induced by the movable electrode is changed, and the vibration powered generator derives the energy as an electric power. Further, applications of such vibration powered generator to various fields have been studied. For example, an electret is formed by forming a fluororesin polymer film on facing surfaces of a pair of substrates, and electrostatic induction conversion device is configured such that one of the pair of substrates is used as a fixed substrate, and the other of the pair of substrates is used as a movable substrate. The movable substrate is configured to move relative to the fixed substrate. The electrostatic induction conversion device configured as described above is applied to a sensor and an actuator. In the electrostatic induction conversion device, the electret and a conductor are coexist on the facing surfaces and the area ratio between the electret and the conductor is defined.

In such vibration powered generator, the movable electrode facing the electret relatively moves by vibration, which is an external energy, and the capacitance between the electret and the movable electrode fluctuates, so that power can be generated. In other words, when a vibration powered generator is used as a power generator, the power generator cannot generate power during the period when kinetic energy such as vibration is not input into the power generator from the outside even when the power generator is connected to a load such as a sensor and an actuator. Thus, use environment of the power generator is limited. Alternatively, in order to efficiently utilize the environmental vibration, it is necessary to devise the arrangement of the electret and the conductor. Thus, an electrode configuration, a support structure of the movable electrode, and the like tend to be complicated.

It is an objective of the present disclosure to provide, using an electret, a power generator that can generate power even during the period when kinetic energy such as vibration is not input to the power generator from the outside.

According to an aspect of the present disclosure, a power generator includes an electret, a first electrode, a second electrode, a third electrode, and at least one of a power storage unit or an output unit. The electret includes a first charged surface and a second charged surface. The first charged surface and the second charged surface have opposite polarities. The first electrode is partially formed on the first charged surface such that the first charged surface has a portion as a current collecting surface that is exposed outward. The second electrode is formed on the second charged surface. The third electrode is disposed to face the first charged surface with a space. The third electrode is configured to move relative to, and in parallel to, the first charged surface. The first electrode and the second electrode form a first power generating unit and the third electrode and the second electrode form a second power generating unit. At least one of the power storage unit or the output unit is electrically connected to both the first power generating unit and the second power generating unit. The electret is formed by polarizing an electret material that includes an inorganic dielectric having a bandgap energy of 4 eV or more.

In the power generator having the above configuration, the inorganic dielectric constituting the electret has a high bandgap energy of 4 eV or more, and can increase the dielectric breakdown voltage during the polarization treatment. Therefore, for example, a high surface potential can be obtained by applying a high voltage under heating conditions. Furthermore, it was found that power could be taken out by forming electrodes on both charged surfaces of the electret, for example, by partially arranging one of the electrodes on the charged surface with a part of the charged surface exposed outward and by connecting the power generating unit to the power storage unit or the output unit.

The reason is not clear, but it is presumed that charge transfer be possible because floating charges are fixed on the exposed current collecting surface due to the high surface potential of the electret and the residual polarization of the inorganic dielectric constituting the electret changes over time. Therefore, by using such configuration as the first power generating unit and arranging it together with the second power generating unit including the movable electrode facing the electret, it is possible to generate power even during a period when no external energy is input into the power generator. By connecting the two power generating units to the power storage unit or the output unit, it is possible to efficiently use electric power with a relatively simple configuration.

As described above, according to the above aspect, it is possible to provide a power generator capable of generating power by using an electret even during a period in which kinetic energy such as vibration is not input from the outside.

First Embodiment

The first embodiment relating to a power generator will be described with reference to the drawings.

As shown in FIG. 1, the power generator 1 of the present embodiment includes a first power generating unit 10A using an electret 2, a second power generating unit 10B, and at least one of a power storage unit 41 and an output unit 42 that is electrically connected to the first power generating unit 10A and the second power generating unit 10B. The power storage unit 41 and the output unit 42 constitute a power supply unit 4, and the power generated by the first power generating unit 10A and the second power generating unit 10B can be supplied to the outside via the power supply unit 4.

The electret 2 has a first charged surface 21 and a second charged surface 22 that are charged with opposite polarities. A first electrode 31 is formed on the first charged surface 21, and a second electrode 32 is formed on the second charged surface 22. The first power generating unit 10A includes the first electrode 31 and the second electrode 32 formed on the electret 2, and the second power generating unit 10B includes the second electrode 32 and a third electrode 33 facing the first charged surface 21.

The electret 2 is formed by polarizing an electret material that contains an inorganic dielectric having a bandgap energy of 4 eV or more. At this time, of the first electrode 31 and the second electrode 32 formed on the electret 2, the first electrode 31 is partially arranged on the first charged surface 21 such that the first charged surface 21 has a portion as a current collecting surface 20 that is exposed outward. The third electrode 33 is disposed to face the first charged surface 21 with a space. The third electrode 33 is configured to move relative to, and in parallel to, the first charged surface 21.

At this time, in the first power generating unit 10A, the current collecting surface 20 is formed on the electret 2, and the power supply unit 4 is electrically connected between the first electrode 31 in contact with the current collecting surface 20 and the second electrode 32. Thereby, electric charge accumulated on the current collecting surface 20 can be derived and stored in the power storage unit 41, or output to the outside through the output unit 42. Further, in the second power generating unit 10B, external energy such as vibration moves the third electrode 33 facing the first charged surface 21 relative to the first charged surface 21, so that the charge induced in the third electrode 33 can move and the charge can be stored in or output to the power supply unit 4.

In this way, by combining the first power generating unit 10A and the second power generating unit 10B, efficient power generation and power supply can be achieved.

Hereinafter, specific examples of the electret 2 used in the power generator 1 will be described in detail.

Specific configuration examples of the first power generating unit 10A, the second power generating unit 10B, and the power generator 1 will be described in detail later.

The electret material forming the electret 2 of the present embodiment contains an inorganic dielectric having a bandgap energy of 4 eV or more as a main component. Here, the "main component" means an electret material composed only of the inorganic dielectric material or an electret material to which some other components are added in the process of converting the inorganic dielectric into the electret material. Further, in the process of converting the electret material into the electret 2, other components may be added to the electret material as long as the desired electret characteristics can be obtained.

The electret 2 is obtained by subjecting such electret material to a polarization treatment. In other words, the electret 2 is obtained through the polarization treatment of an electret material to develop a surface potential of the electret material and charge the electret material. Here, the electret material is, for example, molded into a plate shape having a predetermined thickness, and converted into an electret through polarization in the thickness direction as a polarization direction X. Thereby, a positive or negative charge is retained on the surface of the electret 2. As a result, the electret 2 that provides an electrostatic field around it is obtained.

Here, the up-down direction in FIG. 1 will be referred to as the polarization direction X of the electret 2, and hereinafter, one surface facing in the polarization direction X will be referred to as an upper surface and the opposite surface will be referred to as a lower surface. At this time, the upper surface of the electret 2 is the first charged surface 21 and the lower surface of the electret 2 is the second charged surface 22. The first charged surface 21 and the second charged surface 22 are charged with opposite polarities. Further, in the electret 2, a part of the first charged surface 21, which is the upper surface, is exposed to the atmosphere, and the exposed surface serves as the current collecting surface 20. The second charged surface 22 on the lower surface does not have an exposed surface. However, a part of the second charged surface 22 may be exposed to the atmosphere.

The inorganic dielectric used as the electret material may be an inorganic compound that has an apatite structure containing phosphate ions and hydroxide ions. Apatite is a general term for compounds represented by the composition formula $M_{10}(ZO_4)_6(X)_2$, wherein $ZO_4$ and X in the composition formula correspond respectively to phosphate ion and hydroxide ion. Typically, apatite has a crystal structure whose unit cell is classified into a hexagonal system and space group is $P6_3/m$. Apatite often has a non-stoichiometric composition. The inorganic compound having an apatite structure containing phosphate ions and hydroxide ions is a compound represented by a composition formula $M_{10}(PO_4)_6(OH)_2$. Examples of the metal element M includes divalent alkaline earth metal elements such as Ca.

By using such inorganic compound, the electret 2 having a high surface potential can be obtained, which realizes a high collection amount of charge. Preferably, hydroxyapatite (HA) is used as the inorganic compound that has the apatite structure containing phosphate ions and hydroxide ions. Hydroxyapatite has a composition formula of $(Ca_{10}(PO_4)_6(OH)_2)$ when satisfying stoichiometry, and has a crystal structure in which the unit cell is classified into the hexagonal system and the space group is $P6_3/m$.

It is preferable that the inorganic compound used as the inorganic dielectric material has a hydroxide ion content in the apatite structure that is less than the stoichiometric ratio. Hydroxyapatite with the hydroxide ion content less than the stoichiometric ratio can be synthesized by sintering a raw material powder having hydroxide ions and phosphate ions at a temperature of more than 1250° C. and less than 1500° C., for example, to have a crystal structure of hexagonal hydroxyapatite. In the process, the content of hydroxide ions becomes less than the stoichiometric ratio. This is due to dehydration from the hydroxyl group through heating of the hydroxyapatite, thereby oxyhydroxyapatite (OHA) is generated from the hydroxyapatite, and crystal defects occur.

Alternatively, as the inorganic dielectric, an oxide material containing two different metal elements A and B and having a composite oxide represented by the composition formula $ABO_3$ as a basic composition can also be used. It is preferably to use, as the composite oxide, one having an amorphous structure or one having a perovskite crystal structure. The composite oxide may have a structure having less oxygen content relative to the basic composition due to defects formed in the structure (i.e., $ABO_x$, where $x \leq 3$). Preferably, when the amount of oxygen is less than the stoichiometric ratio of the basic composition, defects are likely to be introduced and the surface potential is likely to increase.

The presence of defects is important for the development of the surface potential in the electret 2, and it is easy to introduce defects by using the composite oxide having an amorphous structure or the composite oxide having a perovskite structure among bandgap materials. With using these composite oxides, the electret 2 having a high surface potential can be obtained, and a high collection amount of charge can be realized.

In the composite oxide having an amorphous structure, defects due to dangling bonds in an unbonded state are likely to be formed compared with an oxide crystal having a perovskite structure of the same composition. In contrast, in the oxide crystal having a perovskite structure, defects can be introduced by element substitution which will be described later. When a composite oxide having an amorphous structure is used, the composite oxide can be processed at a lower temperature than the oxide crystal. Thus, thermal damage to wiring or the like can be suppressed during the device production.

The composite oxide having a perovskite structure is a composite oxide having a perovskite-type crystal structure represented by the composition formula $ABO_3$, and typically has a cubic unit cell. The metal element A is located at each vertex of a cubic crystal, the metal element B is located at a center position of the cubic crystal, and an oxygen atom O is coordinated with respect to each of the metal elements A and B in a regular octahedron. In the perovskite structure, the composite oxide often has a non-stoichiometric composition due to the lack of oxygen atoms. In that case, the composite oxide can be expressed by the composition formula $ABO_x$ ($x<3$), and crystal defects occur because the amount of oxygen is less than the stoichiometric ratio. It is preferable to use a configuration in which the amount of oxygen is less than the stoichiometric ratio to improve the surface potential.

As a specific example of the composite oxide represented by the composition formula $ABO_3$, the metal element A (A site) can be a rare earth element R selected from the group consisting of La, Y, Pr, Sm and Nd, and the metal element B (B site) can be Al. Since a perovskite type composite oxide containing a trivalent rare earth metal element R and a trivalent Al (i.e., $RAlO_3$; rare earth aluminate) has a large bandgap energy of 4 eV or more and relatively small permittivity (e.g., 100 or less), a high surface potential can be realized. In addition, the rare earth aluminate can be manufactured using relatively inexpensive materials, which is advantageous in the manufacturing cost.

In the perovskite structure, the combination of the metal element A occupying the A site and the metal element B occupying the B site is not particularly limited as long as the combination satisfies the composition formula $ABO_3$. In that case, for example, in addition to the combination of the trivalent metal element A and the trivalent metal element B, a combination of monovalent and pentavalent, and a combination of divalent and tetravalent can be used.

In the composition formula $ABO_3$, a part of the metal element A at the A site, a part of the metal element B at the B site, or both of them may be substituted by a dopant element that is different from the metal element A and the metal element B. In that case, when the dopant element is a metal element having a lower valence than the metal elements A and B, defects due to oxygen vacancies are likely to occur in the structure. For example, when the metal element A is a trivalent rare earth element R, a divalent alkaline earth metal element (including Mg) is preferably used as the dopant element, and when the metal element B is a trivalent Al, one or more elements selected from the group consisting of divalent alkaline earth metal elements (including Mg) and Zn are preferably used.

The combination of the metal elements A and B is not particularly limited, and the dopant element may be any metal element having a valence lower than the valence of the metal elements A or B to be substituted by the dopant element. By substituting the metal element A and/or the metal element B by a lower valence dopant element, crystal defects due to oxygen deficiency occur in the perovskite structure in order to maintain electrical neutrality, which contributes to the improvement of the surface potential. Since there is a correlation between the substitution amount of the dopant element and the amount of defects, it is possible to control the amount of defects that affect the surface potential by controlling the introduced amount of the dopant element, so that stable surface potential characteristics can be obtained.

Specifically, lanthanum aluminate ($LaAlO_3$) can be mentioned as a typical example of the rare earth aluminate, and a structure in which a part of La in the lanthanum aluminate is substituted by an alkaline earth metal element (for example, Ca) can be used. In that case, it can be represented by the composition formula $(La, Ca)AlO_{3-\delta}$, where $\delta$ represents the amount of oxygen defects. The amount of oxygen defects varies depending on the substitution amount of the dopant element, the atmosphere, and the like. When a substitution ratio by the dopant element is x (atomic %) and when the oxygen defect is due to the substitution, the composition formula is represented by $La_{(1-x)}Ca_xAlO_{3-x/2}$.

The substitution ratio of the dopant element that substitutes for the metal element A can be appropriately set in the range of, for example, 0.5 atomic % to 20 atomic %. Similarly, the substitution ratio of the dopant element that substitutes for the metal element B preferably falls within the range of, for example, 0.5 atomic % to 20 atomic %. When the substitution ratio is 0.5 atomic % or more, higher surface potential can be obtained as compared with the case where the dopant element is not introduced. Preferably, when the substitution ratio is 1 atomic % or more, the surface potential is significantly improved. However, when the substitution ratio approaches 20 atomic %, the effect obtained by introducing the dopant element tends to decrease. The reason for this is not entirely clear, but it is presumed that an increase in the relative permittivity acts to lower the surface potential. Therefore, it is preferable to appropriately set the substitution ratio within the range less than 20 atomic % so that the desired characteristics can be obtained.

In the present embodiment, the electret 2 is obtained by polarizing the above mentioned inorganic dielectric material, such as a predetermined-shaped sintered body of an inorganic compound having an apatite structure (hereinafter referred to as an inorganic compound sintered body) or a predetermined-shaped sintered body of a composite oxide having a perovskite structure (hereinafter referred to as a composite oxide sintered body). The inorganic compound sintered body or the composite oxide sintered body to be the electret 2 can have an arbitrary outer shape (for example, a rectangular flat plate shape or a disk shape).

Further, the electret 2 may be a film containing such inorganic dielectric material (hereinafter, referred to as an inorganic dielectric film). For example, when the inorganic dielectric material is an inorganic compound, it is an inorganic compound film, and when the inorganic dielectric material is a composite oxide, it is a composite oxide film. Such inorganic dielectric film can be formed as a thin film having a desired thickness by forming an inorganic dielectric material film on a substrate using an arbitrary film forming method such as a sputtering method. As the substrate, in addition to a conductive substrate such as a conductive Si substrate, an insulating substrate can also be used.

Further, the electret 2 may be a composite film in which particles of the inorganic dielectric material are dispersed in a base material film. In this case, using a mixed material of the inorganic dielectric particles and the base material, the composite film having a desired thickness can be formed on a substrate through an arbitrary method such as a printing method. The base material to be the base film may be any material having excellent heat resistance and voltage resistance. The base material may be an organic material such as polyimide or any material that is in a liquid phase to form a film.

As described above, the form of the electret 2 is not particularly limited. When the electret 2 is formed on the substrate, another layer such as a conductive film may be laminated between the electret 2 and the substrate. Alternatively, the electret 2 may be used after being peeled off from the substrate.

The polarization treatment method for forming an electret is not particularly limited, but the polarization treatment may be performed by forming electrodes on opposite surfaces of an electret material having a predetermined shape and applying a voltage to the electret material. As for the polarization treatment conditions, it is desirable to apply a direct-current voltage so that the electric field strength becomes 1 kV/mm or more at 100° C. or higher, for example. In order to realize efficient power generation of the power generator, a surface potential of 100 V or more is required. It is possible to realize a desired surface potential through a polarization treatment with an electric field strength of 1 kV/mm or more. In addition, by performing the polarization treatment at a temperature higher than room temperature, stable electret performance can be realized even in applications whose usage environment is at high temperature.

Next, configuration examples of the first power generating unit 10A and the second power generating unit 10B will be described.

In FIG. 1, the first power generating unit 10A is formed by forming a pair of electrodes on opposite surfaces of the electret 2 obtained as described above. In the electret 2, opposite surfaces in the polarization direction X are charged with opposite polarities. When the upper surface is referred to as the first charged surface 21 (for example, negatively charged surface) and the lower surface is referred to as the second charged surface 22 (for example, positively charged surface), the first electrode 31 and the second electrode 32 are arranged respectively on the first charged surface 21 and the second charged surface 22.

The polarities of the first charged surface 21 and the second charged surface 22 are not limited to this example as long as the first charged surface 21 and the second charged surface 22 have different polarities.

In the first power generating unit 10A, the first electrode 31 arranged on the first charged surface 21 is formed of a plurality of electrode portions 30 electrically connected to each other. An area of the first charged surface 21 where the plurality of electrode portions 30 are not arranged is exposed to the atmosphere, and this exposed surface serves as the current collecting surface 20. On the current collecting surface 20 of the first charged surface 21, an electric charge (for example, negative charge) corresponding to the internal polarization state of the electret 2 is stored. Thereby, a surface potential (for example, negative polarity) is expressed and a part of the electric charge can move through the adjacent first electrode 31 so that the current can be collected.

Figure 2A:
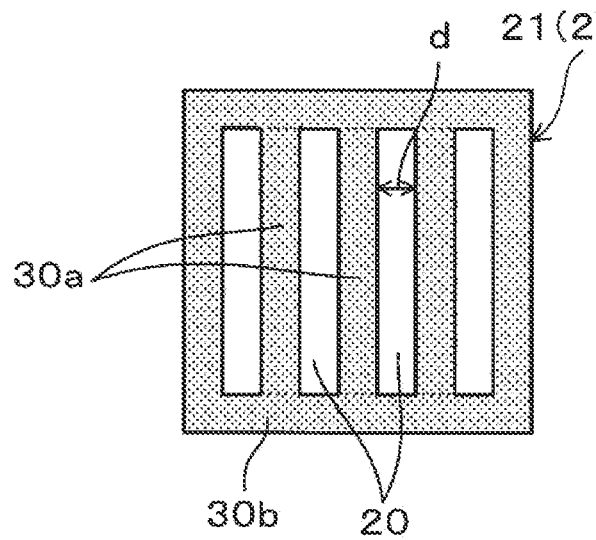
FIG. 2A is a schematic view illustrating an arrangement example of a first electrode formed on a first charged surface of an electret that forms a power generating unit in the first embodiment.
Figure 2B:
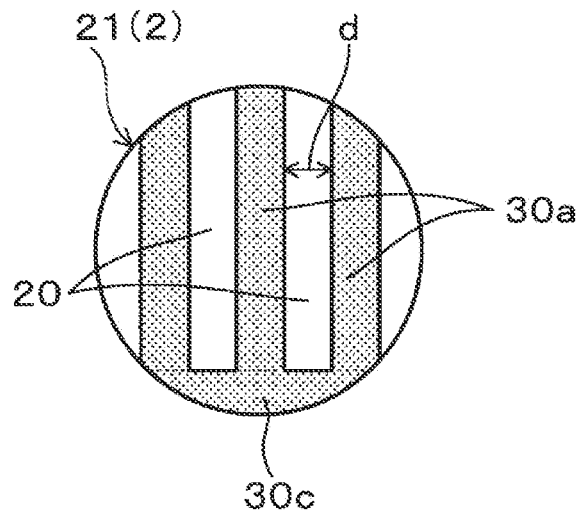
FIG. 2B is a schematic view illustrating an arrangement example of the first electrode formed on the first charged surface of the electret that forms the power generating unit in the first embodiment.

As shown in FIGS. 2A and 2B, the plurality of electrode portions 30 as the first electrode 31 may be formed of a plurality of stripe electrodes 30a parallel to each other and an annular electrode 30b surrounding the stripe electrodes 30a. In the example shown in FIG. 2A, the electret 2 has a rectangular shape, and the annular electrode 30b has a rectangle annular shape having a predetermined width along the peripheral edge of the first charged surface 21 so as to correspond to the first charged surface 21. The stripe electrodes 30a are arranged at a predetermined interval between the stripe electrodes 30a and connect two opposing sides of the annular electrode 30b. Each of the stripe electrodes 30a has a predetermined width.

In the first charged surface 21, the current collecting surface 20 is formed of a plurality of strip-shaped exposed surfaces surrounded by the stripe electrodes 30a and the annular electrode 30b. As described above, when the plurality of current collecting surfaces 20 are formed on the first charged surface 21 and the peripheral edges of the current collecting surfaces 20 are in contact with the stripe electrodes 30a or the annular electrode 30b, movable electric charge accumulated on the current collecting surface 20 can easily derived through the stripe electrodes 30a and the annular electrode 30b.

Alternatively, as shown in FIG. 2B, when the electret 2 has a disk shape, a stripe electrode 30c extending along the peripheral edge of the first charged surface 21 and connecting the plurality of stripe electrodes 30a may be arranged. Alternatively, a circular annular electrode 30b (not shown) having a predetermined width and surrounding the plurality of stripe electrodes 30a may be formed along the peripheral edge of the first charged surface 21. For example, each of the plurality of stripe electrodes 30a has a predetermined width, has one end connected to the stripe electrode 30c, and arranged at predetermined interval therebetween. Alternatively, each of the plurality of stripe electrodes 30a has a predetermined width and arranged at predetermined interval therebetween inside the annular electrode 30b.

In FIG. 1, the second electrode 32 is formed on, for example, the entire surface of the second charged surface 22. The area where the second electrode 32 is arranged is not always limited, and a part of the second charged surface 22 may be exposed to the outside. The first electrode 31, the second electrode 32, and the third electrode 33 of the first and second power generating units 10A and 10B are metal electrodes, and are made of, for example, an electrode material containing precious metals such as gold (Au) and platinum (Pt), or precious metal alloys and the like.

Figure 3:
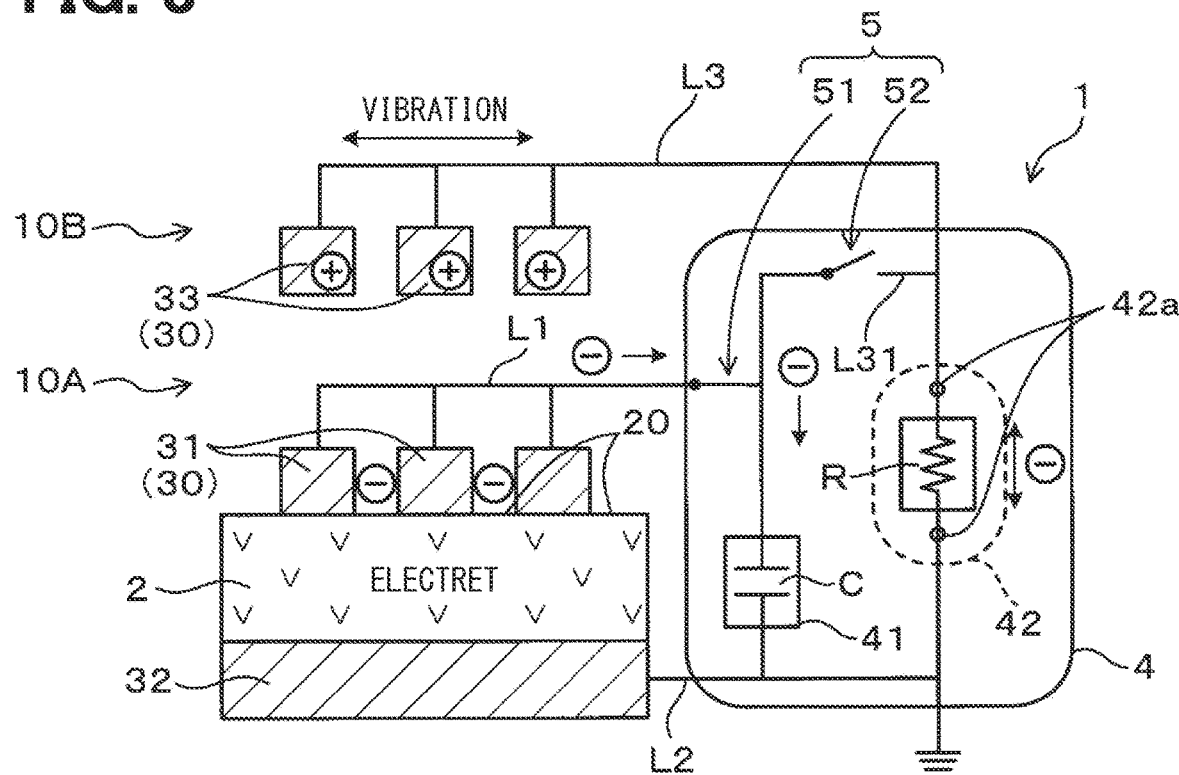
FIG. 3 is a schematic diagram for explaining an operation of the power generating unit and a configuration example of a power supply unit in the first embodiment.

At this time, as shown in FIG. 3, the power storage unit 41 and the output unit 42, which are the power supply unit 4, are electrically connected between the first electrode 31 and the second electrode 32 of the first power generating unit 10A to derive the generated electric charge. The power storage unit 41 and the output unit 42 are connected in parallel between a first wiring L1 connected to the first electrode 31 and a second wiring L2 connected to the second electrode 32, and connected in parallel between a third wiring L3 connected to the third electrode 33 and the second wiring L2. The connection between the first and second power generating units 10A and 10B and the power supply unit 4 can be switched by a switch unit 5.

The power storage unit 41 stores the electric power generated by the first and second power generating units 10A and 10B, and can be configured by using, for example, a power storage element C such as a capacitor. The output unit 42 includes an output terminal portion 42a connected to an external load (load resistance R) or the like, and supplies the power generated by the power generating units 10A and 10B to the outside through the output terminal portion 42a. The output unit 42 may directly supply the power generated by the power generating units 10A and 10B to the outside, or may supply the power stored in the power storage unit 41 to the outside.

In the second power generating unit 10B, the third electrode 33 arranged to face the electret 2 may be formed of a plurality of electrode portions 30 similar to the first electrode 31. The third electrode 33 faces the first charged surface 21 of the electret 2 with a space, and is elastically supported by a supporter (not shown) so as to be movable in a direction parallel to the first charged surface 21. An electric charge having the opposite polarity to the first charged surface 21 (for example, positive polarity) is induced in the third electrode 33, and when vibration or the like is input into the third electrode 33 from the outside and the third electrode 33 moves relative to the first charged surface 21, a part of the electric charge becomes a surplus and can move. As a result, the electric charge generated in the second power generating unit 10B can be stored in the power storage unit 41 of the power supply unit 4 or supplied to the output unit 42.

The configuration of the switch unit 5 is not particularly limited as long as the electric charge generated in the first and second power generating unit 10A and 10B can be supplied to the power storage unit 41 and the output unit 42. Here, for example, there is an open/close switch 51 for opening/closing the first wiring L1. In addition, there is a branching path that connects the third wiring L3 to the power storage unit 41 or the output unit 42, and an open/close switch 52 in the branching path L31 connected to the power storage unit 4.

The switch unit 5 can control on/off of the open/close switches 51 and 52 by a switch controller (not shown). For example, by closing the open/close switch 51 to connect the power generating unit 10 and the power supply unit 4, and by opening the open/close switch 52 to connect the first power generating unit 10A and the power storage unit 41 and to connect the second power generating unit 10B to the output unit 42, the generated electric charge in the first power generating unit 10A can be stored and the electric charge generated through vibration in the second power generating unit 10B can be supplied to the load through the output unit 42.

Figure 4:
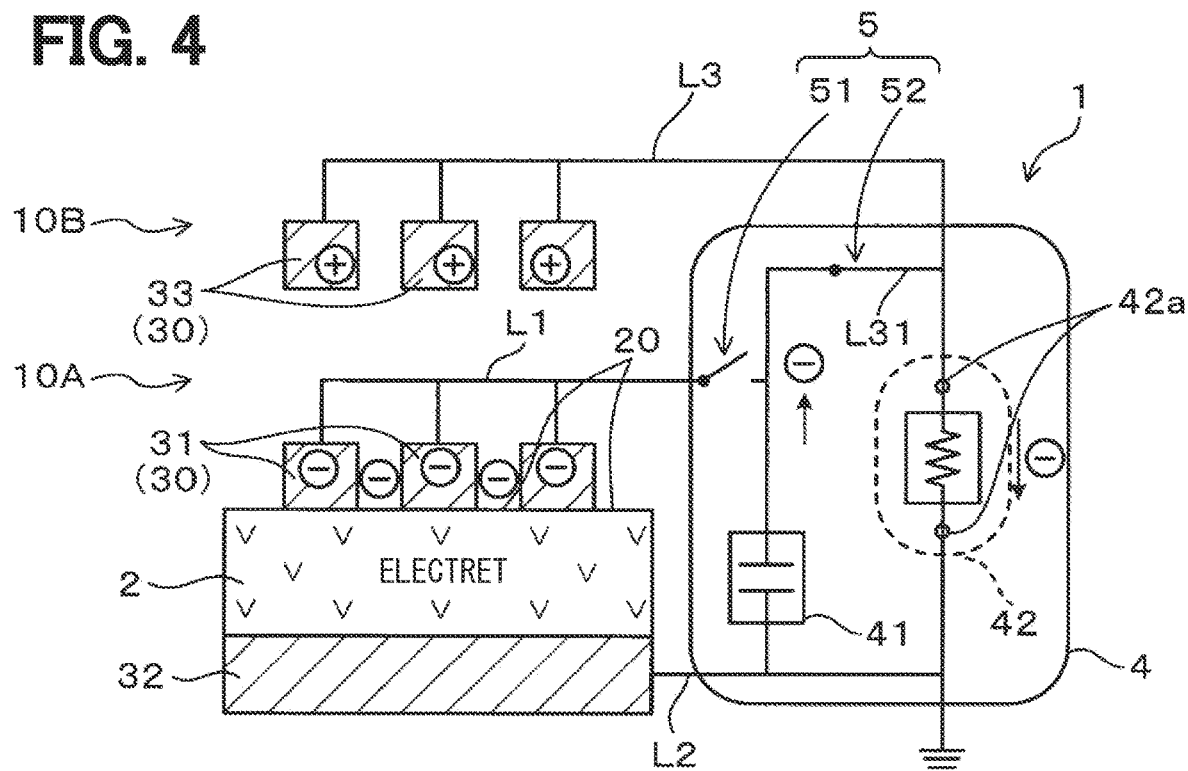
FIG. 4 is a schematic diagram for explaining an operation of the power generating unit and a configuration example of the power supply unit in the first embodiment.

Alternatively, as shown in FIG. 4, by opening the open/close switch 51 and closing the open/close switch 52, the power storage unit 41 can be connected to the output unit 42 while the connection between the first power generating unit 10A and the power supply unit 4 is blocked. In that case, even when the electric charge generated through vibration is not supplied from the second power generating unit 10B, the electric charge accumulated in the power storage unit 41 can be supplied to the load via the output unit 42.

As described above, according to the configuration of this embodiment, the first and second power generating units 10A and 10B and the power supply unit 4 are appropriately connected by switching the switch unit 5. Then, even during a period in which external energy such as vibration is not input to the second power generating unit 10B, the power generated by the first power generating unit 10A or the power stored in the power storage unit 41 can be output to the load.

Here, the mechanism of power generation in the first power generating unit 10A configured in this way is not clear, but for example, it can be considered as follows.

Figure 5:
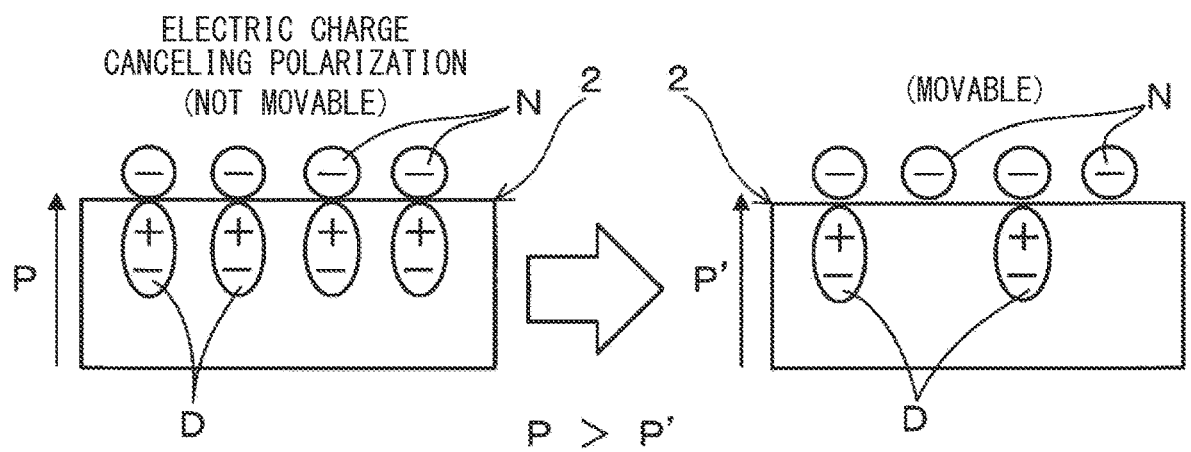
FIG. 5 is a schematic diagram for explaining a power generation mechanism of the power generator in the first embodiment.

As shown in the left figure of FIG. 5, in the electret 2 after the polarization treatment, a large number of electric dipoles D existing inside the inorganic dielectric that is an electric material are arranged in the polarization direction X and a residual polarization P is generated. As a result, charged molecules, ions, etc. (suspended charges) in the atmosphere are adsorbed to the electret 2 according to the polarization direction X of the electret 2. For example, as shown in the figure, when the first charged surface 21 on the upper surface is positively charged, negative charges N that have opposite polarity exist on the first charged surface 21 to cancel the residual polarization P, and these negative charges N are usually retained on the first charged surface 21 and cannot freely move.

In contrast, in the inorganic dielectric material used as the electret material of the present embodiment, it has been found that the electric charges can be derived by arranging the electrodes on opposite surfaces of the electret 2 as in test examples which will be described later. The reasons are not clear, but it is presumed that a movable negative charge N is generated as the magnitude of the residual polarization P changes over time due to the adsorption of atmospheric ions and the like.

For example, as shown in the right figure of FIG. 5, when the residual polarization is changed to P' (P>P'), the electric charge required to cancel the residual polarization is changed. Thus, the electric charge on the first charged surface 21 (i.e., the current collecting surface 20) becomes excessive. In that case, a part of the surplus negative charge N can be collected via the electrode or the like, and the power generating unit 10A can function.

Test Example 1

The electret 2 constituting the first and second power generating units 10A and 10B of the first embodiment was produced by the following method.

As the inorganic dielectric material constituting the electret 2, oxyhydroxyapatite (hereinafter, referred to as OHA; bandgap energy of 5.3 eV), which is an inorganic compound having an apatite structure, was used. Then, a test sample of the electret 2 was prepared as a test example 1 by subjecting an OHA sintered body to a polarization treatment.

<Preparation of Powder>

First, hydroxyapatite (hereinafter, HA) powder described below was prepared as a raw material for the OHA sintered body, and weighed to have a predetermined sample size. Polyvinyl alcohol described below (hereinafter, PVA) was weighed to be 3.2 wt % with respect to the HA powder.

Apatite for biomaterial research HAP monoclinic $Ca_{10}(PO_4)_6(OH)_2$, manufactured by FUJIFILM Wako Pure Chemical Corporation.

Polyvinyl alcohol, degree of polymerization 1500; manufactured by FUJIFILM Wako Pure Chemical Corporation Next, an appropriate amount of pure water was poured into a petri dish, and the weighed PVA was dissolved in the pure water while heating the petri dish on a hot stirrer. Next, the weighed HA was added to the PVA solution in the petri dish and mixed. This petri dish was covered with a wrap film and placed in a dryer pre-heated to 100° C. or higher, and the mixed solution was dried for 1 day or longer.

<Powder Classification and Preparation of Molded Product>

The dried sample was transferred from the petri dish to a mortar and pulverized into powder using a pestle. Next, the powder is classified into 30 μm to 38 μm. Then, about 0.3 g of the classified powder was measured and molded into a 13 mmφ disk shape using a uniaxial pressure molding machine. At this time, the pressure was sequentially applied at 30 MPa for 2 minutes at first, then at 60 MPa for 2 minutes, then at 90 MPa for 2 minutes, and finally at 120 MPa for 3 minutes to obtain a molded product including the HA/PVA mixed powder.

In the case of preparing a larger disk-shaped sample, about 0.55 g of the powder classified into 30 μm to 38 μm was measured and molded into a disk shape of 18 mmφ using a uniaxial pressure molding machine. In this case, the pressure is sequentially applied at 60 MPa for 2 minutes at first, then at 120 MPa for 2 minutes, then at 180 MPa for 2 minutes, and finally at 240 MPa for 3 minutes to obtain a molded product including the HA/PVA mixed powder.

<Preparation of OHA Sintered Body>

The obtained molded product was placed on an alumina sintered board lined with a platinum mesh, and in this state, sintered in the air at 1400° C. for 2 hours using a tube furnace. As a result, a disk-shaped OHA sintered body was prepared.

<Polarization Treatment>

Figure 6:
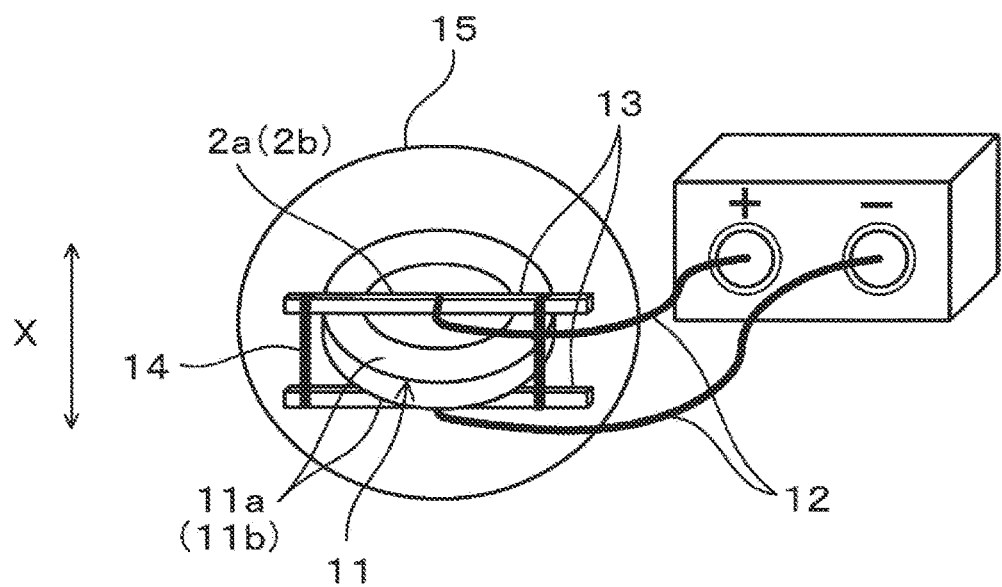
FIG. 6 is a schematic view for explaining a polarization method of an electret in the first embodiment.

The OHA sintered body obtained as described above was subjected to a polarization treatment using a polarization treatment apparatus shown in FIG. 6. In FIG. 6, a pair of gold electrodes 2a and 2b were baked in advance respectively on the upper and lower surfaces 11a and 11b of the OHA sintered body 11 in the thickness direction (i.e., the polarization direction X). Illustration of the gold electrode 2b on the lower surface is omitted. The OHA sintered body 11 was sandwiched between two alumina rods 13 around which platinum wires 12 were wound, so that a voltage could be applied between the pair of gold electrodes 2a and 2b. The two alumina rods 3 were longer than the diameter of the OHA sintered body 11 and were fixed by being tied with threads 14 made of fluororesin (polytetrafluoroethylene) at both ends of the two alumina rods 3 in the longitudinal direction of the alumina rods 3 (i.e., the direction perpendicular to the polarization direction X). Next, this was wrapped around a polarization instrument, and the whole was coated with silicone oil 15 in order to prevent insulation breakdown of air.

This polarization instrument was placed in a box furnace and left until the temperature inside the furnace became stable at 200° C. Next, while keeping the temperature at 200° C., a direct-current electric field of 8.0 kV/mm was applied between the pair of gold electrodes 2a, 2b of the OHA sintered body 11 for 1 hour to perform the polarization treatment. After the lapse of a predetermined time, the sintered body was allowed to cool until the temperature became 40° C. or lower while the direct-current electric field was continuously applied.

<Preparing an Electret>

After the polarization treatment, the pair of gold electrodes 2a and 2b on the opposite surfaces of the OHA sintered body 11 were removed using a polishing sheet. Next, the OHA sintered body 11 was ultrasonically washed with ethanol and pure water for 10 minutes each. The OHA sintered body 11 was left in a dryer at 100° C. for 3 hours or more to obtain the electret 2.

<Surface Potential Measurement>

Figure 7:
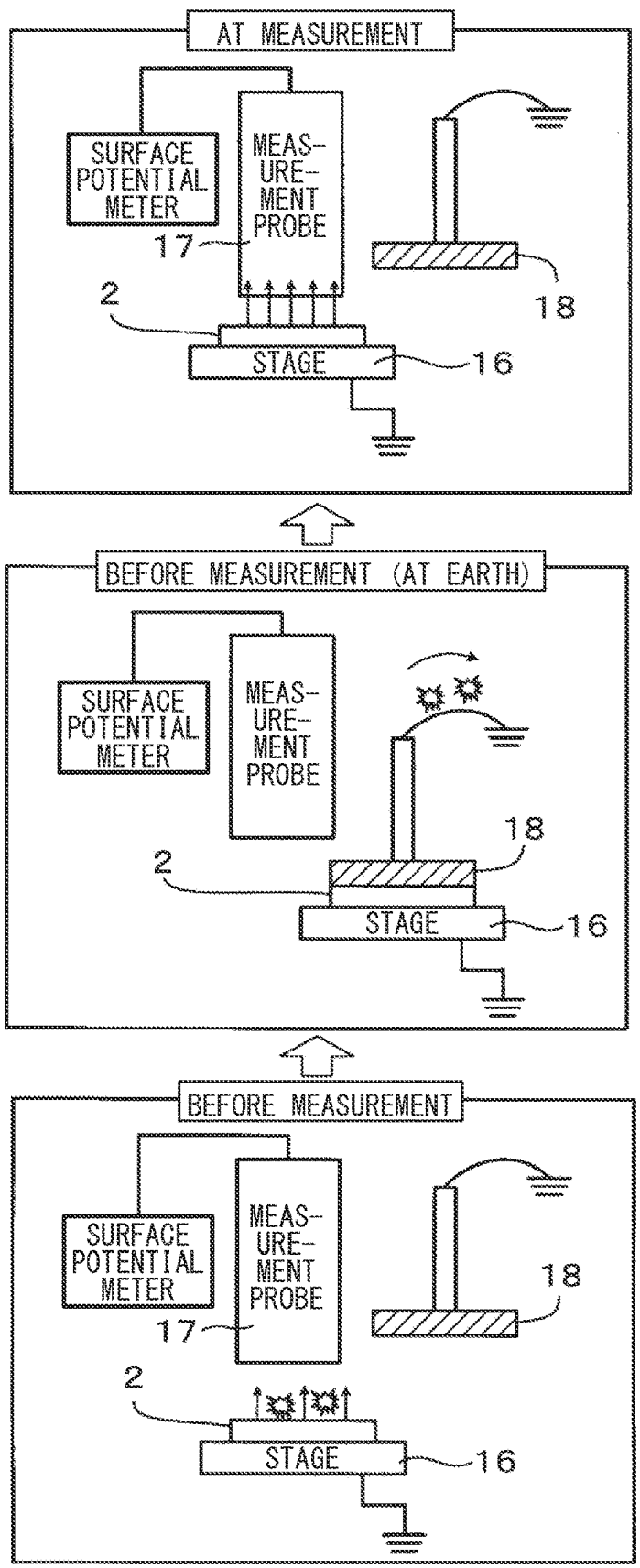
FIG. 7 is a schematic diagram for explaining a method for measuring a surface potential in a test example 1.

As shown in the upper figure of FIG. 7, the electret 2 of the test example 1 obtained as described above was left on the stage 16 connected to the ground, and the surface potential was measured. For the measurement, a surface electrometer (MODEL341-B: manufactured by Trek Japan Co., Ltd.) was used to measure the surface potential in a contactless manner with a measurement probe 17 facing the electret 2, and the value after the lapse of 5400 seconds was read. As the result is shown below, a high surface potential exceeding 3900 V (absolute value) was obtained.

Example 1: OHA Electret Surface Potential: −3947 V

<Repeated Surface Potential Measurement>

Further, the measurement of the surface potential was repeated according to the procedure indicated by the arrows in FIG. 7. First, as shown in the lower figure of FIG. 7, the measurement probe 17 is displaced from a position facing the electret 2, and then, as shown in the middle figure of FIG. 6, the metal electrode plate 18 connected to the ground is brought into contact with the surface of the electret 2 to cause short-circuit. Then, by the method described above, the measurement probe 17 is positioned to face the electret 2 again and the surface potential was measured with the measurement probe 17. This procedure was repeated. The change in the surface potential over time was shown in FIG. 8.

Figure 8:
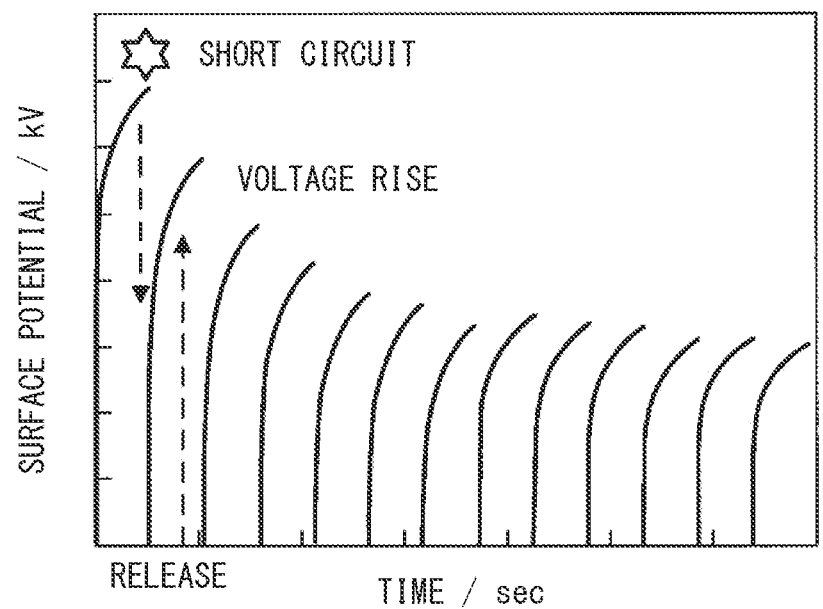
FIG. 8 is a graph illustrating a change in a surface potential of the test example 1 repeatedly measured over time.

As shown in FIG. 8, by short-circuiting, the surface potential of the electret 2 was released and the surface potential was not detected once, but the surface potential was increased again thereafter. Further, by repeating short-circuit and release, the surface potential rises repeatedly. The surface potential decreases from the first time to the second and third times, but it stabilizes with the passage of time. This indicates that when the short-circuit is released, the surface of the electret 2 can be recharged, and the surface potential can be repeatedly recovered.

<Measurement of Dielectric Charge>

Figure 9:
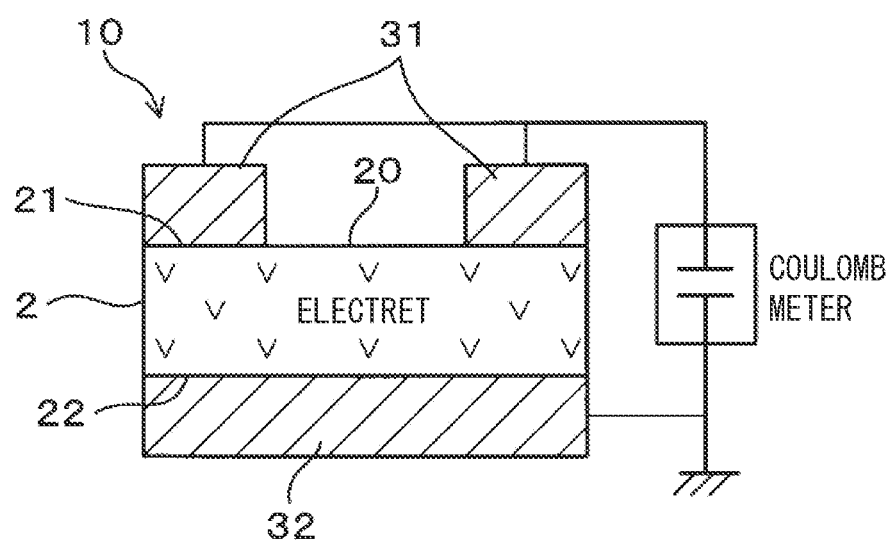
FIG. 9 is a schematic diagram for explaining a method for measuring a dielectric charge in the test example 1.

As schematically shown in FIG. 9, the power generating unit 10 in which the first electrode 31 and the second electrode 32 were formed respectively on the first charged surface 21 and the second charged surface 22 of the electret 2 was formed and a known coulomb meter was connected to the power generating unit 10. The first electrode 31 has an electrode pattern in which the plurality of electrode portions 30 are adjacent to each other with stripe-shaped current collecting surfaces 20 interposed therebetween. The electrode pattern to be the first electrode 31 was formed by arranging a metal mask processed to have a line of 100 μm and a space of 100 μm on the first charged surface 21 of the electret 2 and by sputtering with a gold (Au) target. The thickness of the obtained electrode pattern was about 30 nm.

The power generating unit 10 was left on a metal stage connected to the ground, and a copper electrode plate and a probe of the coulomb meter were simultaneously brought into contact with the first charged surface 21 of the electret 2 to measure dielectric charge. The change in the dielectric charge over time is shown in FIG. 10.

Figure 10:
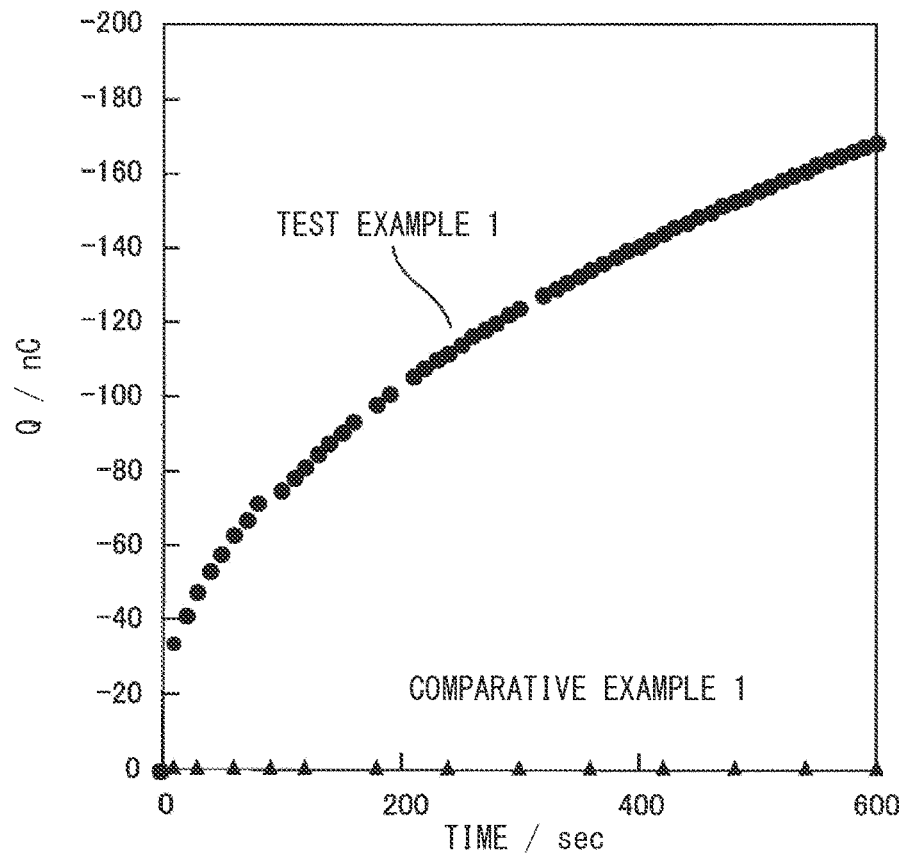
FIG. 10 is a graph illustrating a change in an amount of dielectric charge of the test example 1 over time.

As shown in FIG. 10, by using the electret 2 of the test example 1, it can be seen that the dielectric charge increases with the passage of time, and the charge continues to be accumulated in the capacitor of the coulomb meter over time.

Comparative Example 1

For comparison, a fluororesin based organic polymer described below was used as an electret material and an electret film was formed on a substrate. The surface potential and dielectric charge of the electret film were measured in a similar manner.

CYTOP (registered trademark) CTL-809M manufactured by AGC Inc.

<Preparing the Electret Film>

A film of the above-mentioned fluororesin-based electret material was formed on a copper substrate by spin coating under the conditions of 500 rpm and 30 sec. Then, the obtained film was treated with heat at 200° C. for 1 hour, to produce the fluororesin electret film as the comparative example.

<Polarization Treatment>

A corona discharge device was used for the polarization treatment of the obtained fluororesin electret film. The electret film was left on a stage heated to 120° C. and treated with a corona discharge beam by applying a direct current voltage of −6.44 kV to the electret film to polarize the electret film.

<Surface Potential Measurement>

The surface potential of the fluororesin electret film obtained as described above was measured in the same manner as in the test example 1. As the result is shown below, the surface potential of the fluororesin electret film was 300 V (absolute value), which was much lower than the surface potential of the test sample 1.

Comparative Example 1: Fluororesin Electret Film Surface Potential: −300 V

The results of the test example 1 and the comparative example 1 are shown in Table 1. Note that the magnitude of the surface potential in Table 1 is an absolute value, and in the following description, values without signs are absolute values unless otherwise specified.

TABLE 1

| Test example/ Comparative example | Electret material | Ca substitution amount (atm %) | Surface potential (V) |
|---|---|---|---|
| Test example 1 | OHA | — | 3947 |
| Test example 2 | LAO | 0.5 | 438 |
| Comparative example 1 | Fluororesin | — | 300 |
| Comparative example 2 | LAO | — | 20 |
| Comparative example 3 | $BaTiO_3$ | — | 4 |

<Measurement of Dielectric Charge>

With respect to the obtained electret film, a pattern electrode was formed in the same manner as in the test sample 1, and the dielectric charge was measured. A pattern electrode made of a gold electrode film (thickness of about 300 nm) was formed on the surface of the fluororesin electret film by sputtering in the same manner as in the test example 1. The fluororesin electret film on which this electrode pattern was formed was left on a metal stage connected to the ground, and the dielectric charge was measured by contacting the probe of the coulomb meter with the electrode surface of the fluororesin electret film. The change in the dielectric charge over time is shown in FIG. 10 as the comparative example 1 together with the result of the test example 1.

Here, the result of FIG. 10 shows the change in the dielectric charge that is corrected with reference to the surface potential of the comparative example 1 at the measurement start time. In the comparative example 1 using the fluororesin electret film, almost no change was observed in the dielectric charge over time, and it is assumed that the fluororesin electret film does not serve as a power generating unit. On the other hand, as described above, the power generating unit 10 using the electret 2 of the test example 1 had a higher dielectric charge than the comparative example 1, and the dielectric charge increases with the passage of time, so that the power generating unit 10 using the electret 2 of the test example 1 can be effectively used as a power generator 1.

Test Example 2

The electret 2 constituting the first and second power generating units 10A and 10B of the first embodiment was produced by the following method.

As the inorganic dielectric material constituting the electret 2, a LAO-based composite oxide having a composition in which a part of La in lanthanum aluminate (LaAlO$_3$) having a perovskite structure was substituted by a dopant element was used. Here, the dopant element was Ca and raw materials were prepared to have a composition of (La$_{0.995}$, Ca$_{0.005}$)AlO$_{3-\delta}$ to obtain a composite oxide sintered body. The obtained composite oxide sintered body was polarized to be the electret 2 of the test example 2.

Lanthanum aluminate (LaAlO$_3$), which is a typical composition of the LAO-based inorganic dielectric material, has a bandgap energy of 5.6 eV, and even a configuration in which a part of Al is substituted by Ca, which is a dopant element, has almost the same bandgap energy.

<Preparation of Powder>

First, as raw materials for the LAO-based composite oxide sintered body, the nitrate reagents described below were prepared and weighed so that the substitution amount of Ca was 0.5 atomic %. 20 ml of ultrapure water was added to a beaker containing the reagents to obtain a solution in which the reagents were dissolved.

La(NO$_3$)$_3$.6H$_2$O(3N) 6.03 g manufactured by FUJIFILM Wako Pure Chemical Corporation Al(NO$_3$)$_3$.9H$_2$O(2N) 5.25 g manufactured by FUJIFILM Wako Pure Chemical Corporation Ca(NO$_3$)$_2$.4H$_2$O(3N) 16.5 mg manufactured by FUJIFILM Wako Pure Chemical Corporation The obtained solution of the reagents was transferred to a plastic beaker and mixed with a stirrer. The stirring was performed by placing the stirrer in the plastic beaker and rotating the stirrer at 500 rpm. To the beaker containing this mixed solution, an aqueous NaOH solution having a molar concentration of 12 M was added little by little using a dropper to adjust pH of the solution to 10.5 while measuring pH with a pH meter. Then, a precipitate was filtered under reduced pressure and washed with about 100 ml of ethanol and ultrapure water.

The reagents described below were used for NaOH and ethanol for the NaOH aqueous solution.

NaOH special grade (granular) manufactured by Kanto Chemical Co., Inc.

Ethanol (99.5) manufactured by Kanto Chemical Co., Inc.

Next, the filter paper on which the washed sample was located was placed in a dryer at 120° C., and the sample was dried for 12 hours or more. The dried sample was placed in an agate mortar and pulverized, and was further classified (<100 μm).

<Producing of Molded Body/Sintered Body>

The powder obtained by classification was placed in an alumina boat and pre-burned. As pre-burning conditions, the temperature was raised to 1000° C. at a rate of 2.5° C./min, held at 1000° C. for 6 hours, and then lowered to room temperature at a rate of 2.5° C./min.

The pre-burned sample was placed in an agate mortar and crushed, and was further classified (<100 μm) to obtain a powder for molding. About 0.65 g of the powder was placed in a φ13 mm mold and pressed at a pressure of 250 MPa for 3 minutes to form a disk-shaped molded product.

The obtained molded product was sintered at the temperature above the sintering temperature to obtain an LAO sintered sample composed of an LAO-based composite oxide sintered body. As sintering conditions, the temperature was raised to 1650° C. at a rate of 2.5° C./min, held at 1650° C. for 2 hours, and then lowered to room temperature at a rate of 2.5° C./min. The diameter of the obtained sintered sample was about φ11 mm. The thickness was adjusted to 1 mm by polishing.

Further, the obtained LAO sintered sample was subjected to elemental analysis using ICP emission spectroscopy, and it was confirmed that the obtained sintered body had the desired composition (La$_{0.995}$, Ca$_{0.005}$)AlO$_{3-\delta}$. Specifically, the LAO sintered sample pulverized in the mortar was dissolved in a solvent as an analysis sample, and constituent elements of the sintered body were detected from emission lines generated by ICP (high frequency inductively coupled plasma). As a result, as shown below, almost the same analysis result (0.51 atomic %) was obtained with respect to 0.5 atomic %, which is the Ca substitution ratio at the time of raw material preparation (charged Ca substitution amount).

(Charged Ca Substitution Amount: 0.5 Atomic %)

ICP Analysis Result: 0.51 Atomic %

The analysis of the LAO sintered sample is not limited to the ICP emission spectroscopic analysis method, and any method such as XPS (X-ray photoelectron spectroscopic analysis) method and XRF (fluorescent X-ray analysis) method may be adopted. By introducing the dopant element in this way, the substitution amount can be easily controlled and the quantitative evaluation can be easily performed.

<Polarization Treatment and Surface Potential Measurement>

The LAO sintered sample obtained as described above was subjected to a polarization treatment in the same manner as in the test example 1 to obtain the electret 2. The surface potential of this electret 2 was measured in the same manner. The results are shown in Table 1.

As shown in Table 1, in the test example 2 in which a part of La of LaAlO$_3$ was substituted by Ca, the surface potential was 438 V (absolute value). That is, by applying a direct-current electric field of 8.0 kV/mm to the test example 2, a high surface potential of 400 V or more was obtained.

Comparative Examples 2 and 3

For comparison, a commercially available LaAlO$_3$ (100) single crystal substrate (manufactured by Crystal Base Co., Ltd.) was used as a LaAlO$_3$ sintered body in which La was not substituted, and polarization treatment was performed for the LaAlO$_3$ (100) single crystal substrate in the same manner as in the test example 1 to obtain an electret of the comparative example 2. Further, a sintered body of barium titanate (BaTiO$_3$), which is a composite oxide having a perovskite structure and a bandgap energy of 3.5 eV, was prepared and was subjected to the polarization treatment in the same manner as in the test example 1 to obtain an electret of the comparative example 3.

The surface potentials of the electrets of the comparative examples 2 and 3 were measured in the same manner as in the test example 1. The results are shown in Table 1.

As shown in Table 1, in the comparative example 2, which was composed of a single crystal of LaAlO$_3$, wherein La in the LaAlO$_3$ was not substituted by a dopant element, the surface potential was significantly reduced to 20 V (absolute value). Further, in the comparative example 3 using BaTiO$_3$ having a bandgap energy of less than 4 eV, the surface potential was further reduced to 4 V.

Test Examples 3 to 6

In the same method as in the test example 2, electrets 2 each composed of LAO-based composite oxide sintered body was produced. The substitution ratio (x) of La with the dopant element (Ca) in the composition of La$_{(1-x)}$Ca$_x$AlO$_{3-\delta}$ was changed between the test examples 3 to 6 as follows.

Example 3 (La$_{0.99}$Ca$_{0.01}$) AlO$_{3-\delta}$

Example 4 (La$_{0.95}$Ca$_{0.05}$) AlO$_{3-\delta}$

Example 5 (La$_{0.9}$Ca$_{0.1}$) AlO$_{3-\delta}$

Example 5 (La$_{0.8}$Ca$_{0.2}$) AlO$_{3-\delta}$

As shown in Table 2, the substitution ratio (x) of La by the dopant element (Ca) was varied in the range of 1 atomic % to 20 atomic %. The row materials were prepared to get the desired composition and molded products were prepared with the row materials. The obtained molded products were sintered to get sintered samples. The sintered samples were subjected to polarization treatment to obtain the electrets 2 in the test examples 3 to 6.

The surface potentials of the obtained electrets 2 in the test examples 3 to 6 were measured in the same manner as in the test example 1, and the results were shown in Table 2. Table 2 also shows the relative permittivity of the composite oxide sintered bodies.

TABLE 2

| Test examples | Ca substitution amount (atm %) | Surface potential (V) | Relative permittivity |
|---|---|---|---|
| Test example 3 | 1 | 3433 | 18 |
| Test example 4 | 5 | 3688 | 39 |
| Test example 5 | 10 | 2115 | 46 |
| Test example 6 | 20 | 1400 | 72 |

As is clear from Table 2, the surface potentials in the test examples 3 to 6 are higher than the surface potential in the test example 2, and the surface potentials of 1400 V (test example 6) to 3688 V (test example 4), which are higher than 1000 V, were obtained. It is presumed that this is because, the substitution with the lower valence dopant element with respect to LaAlO$_3$ having the perovskite structure causes oxygen defects according to the amount of substitution, which contributes to the expression of the high surface potentials.

Figure 11:
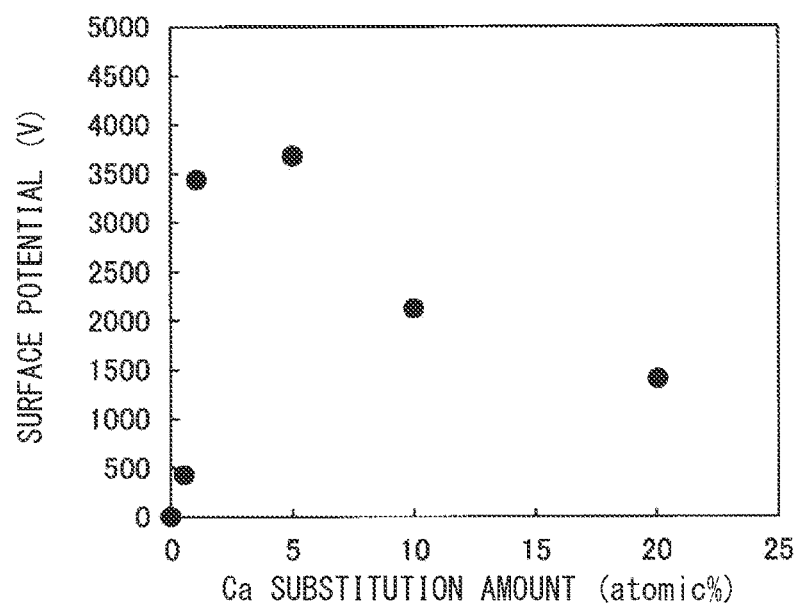
FIG. 11 is a graph illustrating a relationship between Ca substitution amount and the surface potential of a LAO-based composite oxide that is an electret material in a test example 2.

FIG. 11 shows the relationship between the Ca substitution amount and the surface potential based on the comparative example 2 and the test examples 2 to 6. According to FIG. 11, a high surface potential is expressed when the Ca substitution amount is 0.5 atomic % or more. When the Ca substitution amount increases to 1 atomic % to 5 atomic %, the surface potential further increases significantly. Even in the range where the Ca substitution amount exceeds 5 atomic %, a high surface potential is expressed, but the surface potential tends to decrease as the Ca substitution amount increases.

On the other hand, as shown in Table 2, the relative permittivity of the composite oxide sintered body tends to increase as the amount of Ca substitution increases. It is presumed that this is because increase in the amount of oxygen defects according to the substitution ratio with the dopant element increases the surface potential while increase in the relative permittivity makes it easy for charge to leak and suppresses the increase in the surface potential.

From these results, it is desirable that the substitution ratio of the dopant element with respect to the metal elements A and B occupying the A site or the B site of the perovskite structure is preferably in the range of 0.5 atomic % to 20 atomic %.

As described above, by using the inorganic dielectric material made of the composite oxide sintered body, the electret 2 that has excellent thermal stability, whose amount of crystal defects can be controlled, and that has stable characteristics in the usage environment can be formed.

Second Embodiment

The second embodiment of the power generator 1 will be described with reference to the drawings. The basic configuration of this embodiment is the same as that of the first embodiment, and the electrode shape of the first power generating unit 10A is modified. Hereinafter, the differences will be mainly described.

Those of reference numerals used in the second and subsequent embodiments which are the same reference numerals as those used in the above-described embodiments denote the same components as in the previous embodiments unless otherwise indicated.

In the first embodiment, as shown in FIGS. 2A and 2B, the first electrode 31 on the first charged surface 21 of the disk-shaped or rectangular-shaped electret 2 is formed of the stripe electrodes 30a, 30c and the annular electrode 30b. However, these electrode shapes are examples and may have different shapes. For example, as shown in FIG. 12, the electrode portions 30 may not be surrounded by the annular electrode 30b as long as connected to each other.

Figure 12:
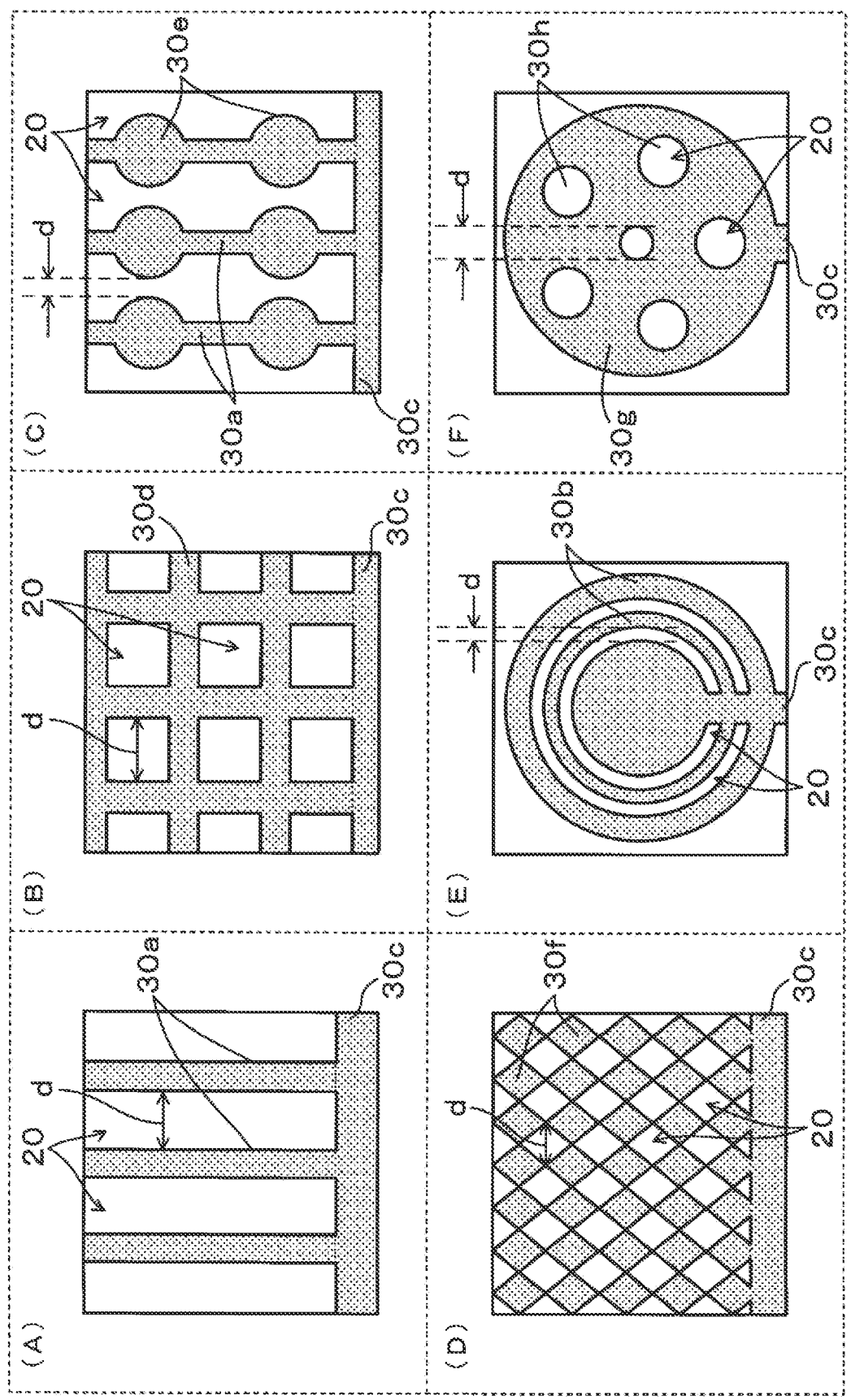
FIG. 12 is a schematic view illustrating shape examples of electrode forming portions to be a first electrode formed on an electret in the second embodiment.

Specifically, as shown in (A) of FIG. 12, a stripe electrode 30c perpendicular to the stripe electrodes 30a that are arranged parallel to each other may be formed along one side of the first charged surface 21. The stripe electrode 30c connects one ends of the stripe electrodes 30a. Further, as shown in (B), a grid-like electrode 30d may be used instead of the stripe electrodes 30a, and as shown in (C), each of the stripe electrodes 30a may not have a constant width. In that case, the both ends of each of the stripe electrodes 30a has, for example, a part protruding outward into an arc shape as an arc-shaped electrode 30e.

Further, as shown in FIG. 12, a shape of a combination of diamond-shaped electrodes 30f connected to each other at the apexes as shown in (D), a shape of a combination of a plurality of annular electrodes 30b that have coaxial circular shapes as shown in (E), and a shape of a circular electrode 30g defining a plurality of circular holes 30h as shown in (F) may be adopted. In any shape, exposed portions between the plurality of electrode portions 30 and exposed portions through the holes 30h are used as the current collecting surface 20. Further, the stripe electrode 30c is formed at the peripheral edge of the first charged surface 21 so that the plurality of electrode portions 30 are connected to each other, and drawn out to the outside.

As described above, the shape of each of the electrode portions 30 or the shape of the electrode collective portion of the electrode portions 30 can be arbitrarily selected. Of course, the shape other than those shown in FIG. 12 can be used.

As shown in FIG. 13, instead of forming the annular electrode 30b and the stripe electrode 30c that connect the plurality of electrode portions 30 to each other, wire bonding may be used to connect the plurality of electrode portions 30. In that case, as shown in (A) of FIG. 13, a plurality of wires W are connected respectively to the plurality of stripe electrodes 30a (see (A) in FIG. 12). Further, in (B) of FIG. 13, a plurality of rectangular electrodes 30i are arranged to be surrounded by a portion where the grid-like electrode 30d is formed in (B) of FIG. 12 while the portion is used as the current collecting surface 20. Then, the plurality of rectangular electrodes 30i are connected by a plurality of wires W.

Further, as shown in (C) to (E) of FIG. 13, each of the plurality of circular electrodes 30g, the plurality of diamond-shaped electrodes 30f, and the plurality of annular electrodes 30b may be connected by a plurality of wires W. In the case of the circular electrode 30g shown in (F) of FIG. 13, a single wire W is connected to the circular electrode 30g and drawn out to the outside.

At this time, in order to efficiently take out electric charges with the first power generating unit 10A, it is desirable that at least a part of a distance between adjacent ones of the plurality of electrode portions 30 is equal to or less than 8 mm. In other words, it is desirable that the width of a part of the current collecting surface 20 between adjacent ones of the plurality of electrode portions 30 is equal to or less than 8 mm. Preferably, it is desired that an area where the electrode distance is equal to or less than 8 mm is as wide as possible. For example, it is better to design the electrode shape and the arrangement of the electrode such that the electrode distance of the first electrode 31 is about or less than 8 mm in a main area of the first charged surface including a center potion of the first charged surface. As the electrode distance decreases from 8 mm, the width of the current collecting surface 20 between the electrode portions is narrowed. Thus, electric charge accumulated on the current collecting surface 20 is more likely to be collected through the adjacent electrode portions 30.

Further, in the second power generating unit 10B, in order to generate electric charge in the third electrode 33 through an electrostatic induction, it is desirable that a distance between adjacent ones of the electrode portions 30 in the first electrode 31 is equal to or greater than 100 µm (0.1 mm) in at least a part. Preferably, it is desired that an area where the electrode distance is 100 µm or more is as wide as possible. For example, it is desired to design the electrode shape and the arrangement such that the electrode distance serving as the first electrode 31 is about 100 µm or more in the main area including the center portion of the first charged surface. This makes it possible to set the surface potential of the first charged surface 21 to 100 V or more, and generate electric charges efficiently on the third electrode 33 facing the first charged surface 21 in the second power generating unit 10B.

Therefore, in the first electrode 31, it is desirable that at least a part of the electrode distance between adjacent ones of the plurality of electrode portions 30 falls within a range between 100 µm, inclusive, and 8 mm, inclusive. As a result, the first power generating unit 10A can efficiently collect the electric charge of the current collecting surface 20, while the second power generating unit 10B can generate an induced charge by the remaining electric charge on the current collecting surface 20.

Test Example 3

As shown in FIG. 14A, a plurality of electrode portions 30 to be the first electrode 31 are formed on the first charged surface 21 of the disk-shaped electret 2 that is formed in the same manner as in the test example 1, and test samples are prepared by varying the electrode distance between the electrode portions 30. Each of the electrode portions 30 has a substantially semicircular shape. The electrode portions 30 are arranged so that their linear sides facing each other are parallel to each other. The electrode distance d that is the shortest distance between the electrode portions 30 is changed between 0.1 mm (100 µm), 1 mm, 2 mm, 4 mm, 6 mm and 8 mm to prepare the test samples (Samples 1 to 6).

These test samples are electrets 2 formed by preparing OHA sintered body in the same manner as the test sample 1 and applying a direct-current electric field of 8.0 kV/mm to the OHA sintered body at 200° C. for 1 hour for polarization treatment. After the gold electrodes for the polarization treatment are polished and removed, the electrets 2 are subjected to sputtering under masking in the same manner as in the test example 1, thereby gold electrode films to be the electrode portions 30 are formed on the electret 2 such that the electrode distance falls within a range between 0.1 mm (100 µm) to 8 mm.

The surface potentials of the test samples obtained as described above were measured in the same manner as in the test example 1, and the surface charge state was evaluated. At that time, the electric field of the electret 2 was partially electrostatically shielded by connecting the plurality of electrode portions 30 to the ground. The surface potential measurement results of the test samples are shown in Table 3 and FIG. 14B.

TABLE 3

| Sample No. | Electrode distance (mm) | Surface potential (V) |
| --- | --- | --- |
| Sample 1 | 8 | 3670 |
| Sample 2 | 6 | 2930 |
| Sample 3 | 4 | 1813 |
| Sample 4 | 2 | 1163 |
| Sample 5 | 1 | 400 |
| Sample 6 | 0.1 | 105 |

As shown in Table 3, the surface potentials of Samples 1 to 6 are all less than that of the test example 1 (surface potential: 3947 V). Further, as shown in FIG. 14B, in the sample 1 having the electrode distance d of 8 mm, the surface potential is as high as 3670 V, and the surface potential decreased as the electrode distance d decreases as shown in the sample 2 (d=6 mm), the sample 3 (d=4 mm), the sample 4 (d=2 mm) and the sample 5 (d=1 mm). In the sample 6 (d=0.1 mm), the surface potential is 105 V. The decrease in the surface potential occurs because, in the electret 2 of the test example 1, charges on the current collecting surface 20 move through the first electrode 31 arranged on the first charged surface 21.

From these results, when the first electrode 31 is formed on the first charged surface 21 such that the first charged surface has the current collecting surface 20 and at least a part of the electrode distance d between the electrode portions 30 is 8 mm or less, the function of collecting charges can be obtained. Further, the smaller the electrode distance d is, the more easily electric charge on the current collecting surface 20 moves to the adjacent electrode portion 30, so that the surface potential decreases more. Thus, it is preferable to set an area where the electrode distance is 8 mm or less is as wide as possible to improve power generation in the first power generating unit 10A.

On the other hand, even in the sample 6 having the electrode distance d of 0.1 mm, a relatively high surface potential of 105 V is maintained, and as a result, a function of generating induced charge in the third electrode 33 can be obtained in the second power generating unit 10B. Further, the wider the area where the electrode distance d is 0.1 mm or more, or the longer the electrode distance d from 0.1 mm, the more advantageous the power generation in the second power generating unit 10B.

From these results, it is desirable that at least a part of the electrode distance d between adjacent ones of the electrode portions 30 falls within a range between 100 μm, inclusive, and 8 mm, inclusive. Therefore, preferably, the arrangement of the first electrode 31 on the first charged surface is set such that desired power generation capacity can be obtained in both the first power generating unit 10A and the second power generating unit 10B.

As described above, the power generator 1 that can generate power even in an environment in which external force is not input into the power generator 1 is obtained with the first power generating unit 10A formed by using an inorganic dielectric material having bandgap energy of 4 eV or more as the electret material, polarizing the electret material to form the electret 2, and partially disposing an electrode on at least one surface of the electret 2 such that the at least one surface has a portion as a current collecting surface 20 that is exposed outward. Further, with the second power generating unit 10B configured such that an electrode is movably arranged to face the current collecting surface 20, power generation can be archived during a period when external energy is input into the power generator 1. Thus, efficient power generator 1 with a combination of the first power generating unit 10A and the second power generating unit 10B can be realized.

The present disclosure is not limited to the respective embodiments described above, and various modifications may be adopted within the scope of the present disclosure without departing from the spirit of the disclosure. For example, the power generator 1 may be configured to include a load connected to the output unit 42 of the power supply unit 4 that is connected to the first and second power generating units 10A and 10B, or the output unit 42 may not include a load and may be configured as an output terminal portion 42a for external output. Further, the power supply unit 4 may be formed of only the power storage unit 41 or the output unit 42.

What is claimed is:

1. A power generator comprising:
    an electret including a first charged surface and a second charged surface, the first and second charged surfaces having opposite polarities,
    a first electrode partially formed on the first charged surface such that the first charged surface has a portion as a current collecting surface that is exposed outward,
    a second electrode formed on the second charged surface,
    a third electrode disposed to face the first charged surface with a space, the third electrode being configured to move relative to, and in parallel to, the first charged surface, and
    at least one of a power storage unit or an output unit, wherein
    the first electrode and the second electrode form a first power generating unit,
    the third electrode and the second electrode form a second power generating unit,
    at least one of the power storage unit or the output unit is electrically connected to both the first power generating unit and the second power generating unit, and
    the electret is formed by polarizing an electret material that includes an inorganic dielectric having a bandgap energy of 4 eV or more.

2. The power generator according to claim 1, wherein the inorganic dielectric is an inorganic compound that has an apatite structure including phosphate ions and hydroxide ions.

3. The power generator according to claim 1, wherein the inorganic dielectric is a composite oxide that contains a metal element A and a metal element B and that has a basic composition expressed as $ABO_3$, and the composite oxide has an amorphous structure or a perovskite structure.

4. The power generator according to claim 3, wherein the metal element A is a rare earth element R selected from the group consisting of La, Y, Pr, Sm and Nd, and the metal element B is Al.

5. The power generator according to claim 4, wherein the composite oxide has a composition in which a part of at least one of the metal element A or the metal element B is substituted by a dopant element that is different from the metal element A and the metal element B, the dopant element that substitutes for the metal element A is an alkaline earth metal element, and the dopant element that substitutes for the metal element B is at least one element selected from the group consisting of an alkaline earth metal element and Zn.

6. The power generator according to claim 1, wherein the first electrode is formed of a plurality of electrode portions adjacent to the current collecting surface.

7. The power generator according to claim 6, wherein at least a part of an electrode distance between the plurality of electrode portions falls within a range between 100 μm, inclusive, and 8 mm, inclusive.

* * * * *